US008842478B2

(12) United States Patent
Kato

(10) Patent No.: US 8,842,478 B2
(45) Date of Patent: Sep. 23, 2014

(54) NONVOLATILE SEMICONDUCTOR MEMORY DEVICE

(75) Inventor: Koji Kato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 13/616,718

(22) Filed: Sep. 14, 2012

(65) Prior Publication Data

US 2013/0242660 A1    Sep. 19, 2013

(30) Foreign Application Priority Data

Jan. 10, 2012    (JP) .................................. 2012-002388

(51) Int. Cl.
*G11C 16/04*    (2006.01)
*G11C 16/10*    (2006.01)
*G11C 16/12*    (2006.01)

(52) U.S. Cl.
CPC ................ *G11C 16/10* (2013.01); *G11C 16/12* (2013.01); *G11C 16/0483* (2013.01)
USPC .................................. 365/185.18; 365/185.17

(58) Field of Classification Search
CPC ..... G11C 16/10; G11C 16/0483; G11C 16/12
USPC ............... 365/185.3, 185.29, 185.22, 185.17, 365/185.27, 185.15, 185.18
See application file for complete search history.

(56) References Cited

U.S. PATENT DOCUMENTS

| 7,382,653 | B2 |  | 6/2008 | Arai et al. |  |
|---|---|---|---|---|---|
| 7,443,734 | B2 |  | 10/2008 | Shibata |  |
| 8,050,098 | B2 |  | 11/2011 | Park |  |
| 8,456,918 | B2 | * | 6/2013 | Oh et al. | ................ 365/185.23 |
| 2009/0257280 | A1 | * | 10/2009 | Oh et al. | ................ 365/185.19 |

FOREIGN PATENT DOCUMENTS

| JP | 2007-87513 | 4/2007 |
|---|---|---|
| JP | 2007-180230 | 7/2007 |
| JP | 2008-103019 | 5/2008 |
| JP | 2009-283118 | 12/2009 |

\* cited by examiner

*Primary Examiner* — Gene Auduong
(74) *Attorney, Agent, or Firm* — Oblon, Spivak, McClelland, Maier & Neustadt, L.L.P.

(57) ABSTRACT

According to one embodiment, in a write control unit that performs writing on a selected memory cell connected to a selected word line by making to apply a program voltage to the selected word line while making to apply an intermediate voltage to unselected word lines, an isolation voltage is controlled to be applied to any word line of the unselected word lines at a time of applying the program voltage and the isolation voltage is controlled to increase before the intermediate voltage is removed after applying the program voltage.

16 Claims, 14 Drawing Sheets

— 1 —

NONVOLATILE SEMICONDUCTOR MEMORY DEVICE

CROSS-REFERENCE TO RELATED APPLICATIONS

This application is based upon and claims the benefit of priority from Japanese Patent Application No. 2012-2388, filed on Jan. 10, 2012; the entire contents of which are incorporated herein by reference.

FIELD

Embodiments described herein relate generally to a nonvolatile semiconductor memory device.

BACKGROUND

Memory cells of a nonvolatile semiconductor memory device can perform electrical rewriting, for example, by transferring charges between a charge storage layer, such as a floating gate or a dielectric film including a charge trap, and a semiconductor substrate. In the memory cell, transfer of charges is performed by applying a high electric field to a tunnel dielectric film between the charge storage layer and the substrate when writing data "0". Moreover, in order to prevent erroneous writing to a selected cell when writing data "1" to the selected cell, a high electric field is prevented from being applied to the tunnel dielectric film of the selected cell by boosting the channel of the selected cell.

At this time, when memory cells on which writing has been performed increases, a boost coupling ratio decreases, so that erroneous writing is easy to occur. Therefore, in order to stabilize a boost level, a method called channel isolation of electrically isolating memory cells, on which has been written, when boosting a channel is used in some cases.

DETAILED DESCRIPTION

In general, according to a nonvolatile semiconductor memory device in embodiments, a memory cell array, word lines, bit lines, a write control unit, and an isolation control unit are included. In the memory cell array, memory cells forming NAND strings are arranged in a matrix manner in a row direction and a column direction. The word line selects a memory cell in the row direction. The bit line selects a memory cell in the column direction. The write control unit performs writing on a selected cell by making to apply a program voltage to a word line of a selected row while making to apply an intermediate voltage, which forms a channel transmitting a bit line voltage of a selected column to the selected cell, to a word line of an unselected row. The isolation control unit makes to apply an isolation voltage to any word line of unselected rows to separate the channels between a written memory cell and an unwritten memory cell at a time of applying the program voltage and makes to apply an electric field relaxing voltage to a word line adjacent to a word line to which the isolation voltage is applied, and makes the isolation voltage and the electric field relaxing voltage equal to the intermediate voltage so that the channels are connected between the written memory cell and the unwritten memory cell before the intermediate voltage is removed.

A nonvolatile semiconductor memory device according to the embodiments will be explained below with reference to the drawings. The present invention is not limited to these embodiments.

First Embodiment

Figure 1:
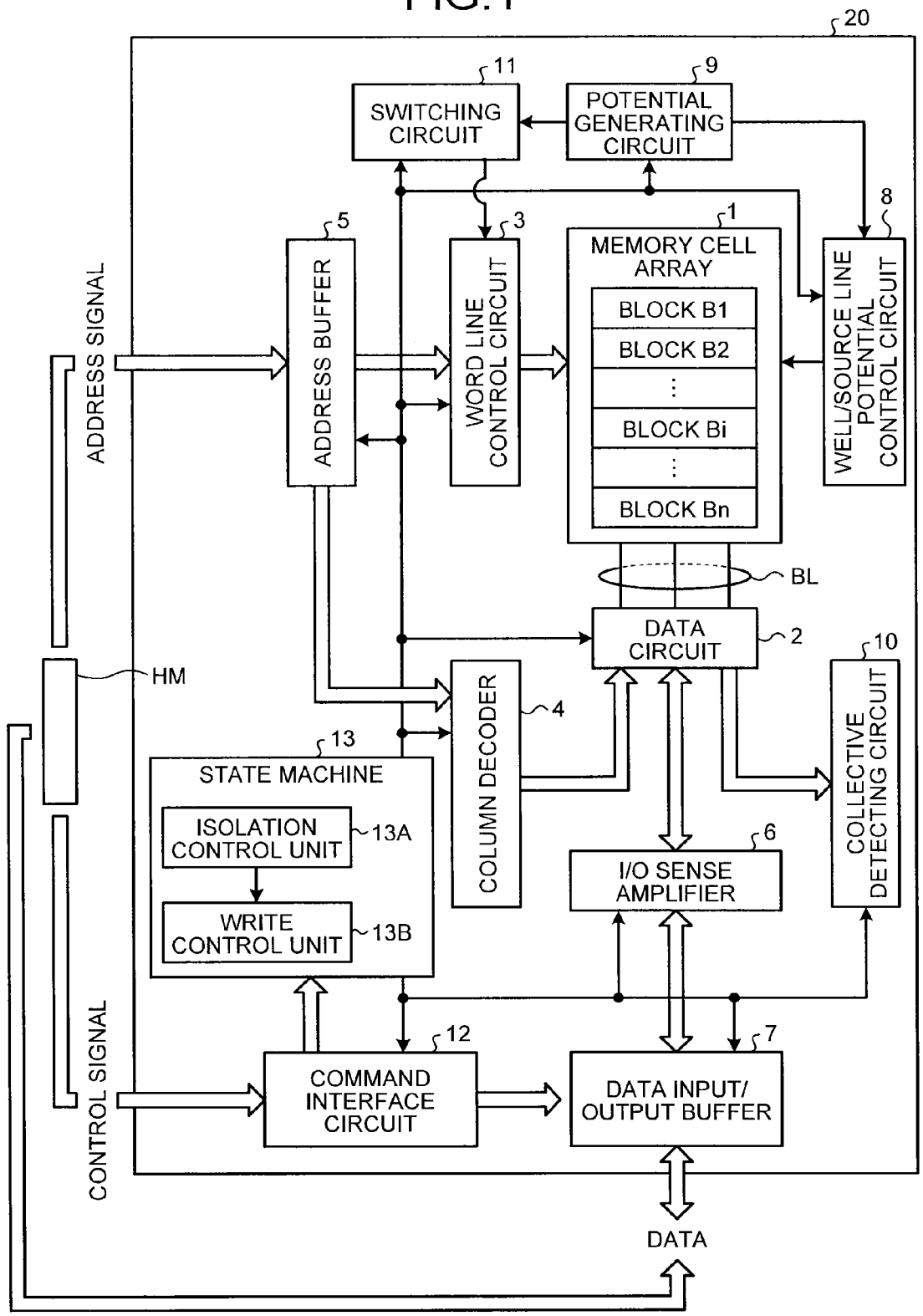
FIG. 1 is a block diagram illustrating a schematic configuration of a nonvolatile semiconductor memory device according to a first embodiment.

FIG. 1 is a block diagram illustrating a schematic configuration of a nonvolatile semiconductor memory device according to the first embodiment. An example in FIG. 1 illustrates a main portion of a 16-value NAND cell-type flash memory as an example.

In FIG. 1, a memory chip 20 includes a memory cell array 1, a data circuit 2, a word line control circuit 3, a column decoder 4, an address buffer 5, an I/O sense amplifier 6, a data input/output buffer 7, a well/source line potential control circuit 8, a potential generating circuit 9, a switching circuit 11, a collective detecting circuit 10, a command interface circuit 12, and a state machine 13.

The memory cell array 1 includes n (n is a positive integer) number of blocks B1 to Bn and NAND strings are arranged in each of the blocks B1 to Bn. A NAND string can, for example, be composed of a plurality of memory cells connected in series with each other and two select gates connected to both ends of the series-connected memories, respectively.

The data circuit 2 includes a plurality of latches (memory circuits). The data circuit 2 temporarily stores write data of 4 bits (16 values) at the time of writing and stores read data of 4 bits (16 values) at the time of reading. Therefore, at least six latches are provided for one bit line BL connected to a memory cell selected as a target for a write/read operation. One of the six latches stores logical lower page data and another one of them stores logical upper page data.

The word line control circuit 3 includes a row address decoder and a word line driver. The word line control circuit 3 controls a potential of a plurality of word lines in the memory cell array 1 based on an operation mode (write, erase, read, and the like) and an address specified by a row address signal.

The column decoder 4 selects a column of the memory cell array 1 based on a column address signal. At the time of programming, write data is input into a memory circuit in the data circuit 2 belonging to a selected column via the data input/output buffer 7 and the I/O sense amplifier 6. Moreover, at the time of reading, read data is temporarily stored in a memory circuit in the data circuit 2 belonging to a selected column and is thereafter output to the outside of the memory chip 20 via the I/O sense amplifier 6 and the data input/output buffer 7.

A row address signal in an address signal is input to the word line control circuit 3 via the address buffer 5. A column address signal is input to the column decoder 4 via the address buffer 5.

The well/source line potential control circuit 8 controls a potential of a plurality of well regions (for example, double well region including an n well and a p well) corresponding to the blocks B1 to Bn and a potential of a source line according to an operation mode (write, erase, read, and the like).

The potential generating circuit 9, for example, generates a program voltage VPGM (for example, about 20 V), intermediate voltages VPA and VPB (for example, about 10 V), and the like at the time of writing. The intermediate voltages VPA and VPB can form a channel that transmits a bit line voltage of a selected column to a selected cell in a NAND string. Specifically, the word line control circuit 3 applies an intermediate potential and the like to a gate electrode of a memory cell to form a channel region in a channel portion of the memory cell (a region substantially immediately under the gate electrode of the memory cell or a region between impurity diffusion layers (source and drain) of the memory cell). Consequently, the impurity diffusion layers of the memory cell are electrically connected, so that a bit line voltage of a selected column can be transmitted to a selected cell. Moreover, the potential generating circuit 9 generates an isolation voltage VISO and an electric field relaxing voltage VGP at the time of writing. The isolation voltage VISO is voltage that is applied before applying the program voltage VPGM (preferably, before or substantially simultaneously with application of the intermediate voltages VPA and VPB) and can separate channels between the bit line BL and a source line. Specifically, a channel region is not formed in a channel portion of a memory cell by applying the isolation voltage to the gate electrode of the memory cell by the word line control circuit 3. Consequently, the impurity diffusion layers of the memory cell are electrically isolated from each other. That is, channels of a NAND string are separated into channels on a bit line side and channels on a source line side by the isolation voltage VISO. The electric field relaxing voltage VGP can relax an electric field around a channel of a memory cell to which the isolation voltage VISO is applied. The program voltage VPGM, the intermediate voltages VPA and VPB, the isolation voltage VISO, and the electric field relaxing voltage VGP are applied to one or more word lines in one or more selected blocks selected from the blocks B1 to Bn by the switching circuit 11. The intermediate voltage VPA can be used for forming channels on one side isolated by the isolation voltage VISO and the intermediate voltage VPB can be used for forming channels on the other side isolated by the isolation voltage VISO. The intermediate voltages VPA and VPB may be equal to each other or may be different from each other.

The potential generating circuit 9, for example, generates an erase potential VE (for example, about 20 V) at the time of erasing. Then, the erase potential VE is applied to one or more well regions (both of an n well and a p well) corresponding to one or more selected blocks selected from the blocks B1 to Bn.

The collective detecting circuit 10 verifies whether predetermined data is correctly written in a memory cell at the time of programming and verifies whether data in a memory cell is completely erased at the time of erasing.

The command interface circuit 12 determines whether data input to the data input/output buffer 7 is command data provided from a host microcomputer based on a control signal generated by a chip (for example, a host microcomputer or a memory controller HM) different from the memory chip 20. When data input to the data input/output buffer 7 is command data, the command interface circuit 12 transfers the command data to the state machine 13.

The state machine 13 determines an operation mode (write, read, erase, or the like) of a NAND flash memory based on command data and controls an operation of the whole NAND flash memory, specifically, each of the operations of the data circuit 2, the word line control circuit 3, the column decoder 4, the address buffer 5, the I/O sense amplifier 6, the data input/output buffer 7, the well/source line potential control circuit 8, the potential generating circuit 9, the switching circuit 11, and the collective detecting circuit 10 according to the operation mode.

The state machine 13 includes an isolation control unit 13A and a write control unit 13B as a configuration relating to write control. The write control unit 13B can perform writing on a selected cell by applying the program voltage VPGM to a word line (hereinafter, referred to as "selected word line" in some cases) of a selected row while applying the intermediate voltages VPA and VPB, which form a channel transmitting a bit line voltage of a selected column to a selected cell, to a word line (hereinafter, referred to as "unselected word line" in some cases) of an unselected cell. The isolation control unit 13A and the write control unit 13B can be integrally arranged in the state machine 13 as a control unit.

The isolation control unit 13A applies the isolation voltage to any word line of unselected rows to separate channels of a NAND string into channels on a bit line side and channels on a source line side before applying the program voltage VPGM. A channel portion of a memory cell connected to a selected word line can be controlled to belong to a channel on a source line side. Furthermore, the isolation control unit 13A can control the isolation voltage VISO so that channels between the bit line BL and a memory cell belonging to a selected row are connected to channels of memory cells belonging to unselected rows before the intermediate voltages VPA and VPB are removed after applying the program voltage VPGM (or, positive voltage, which is sufficient to connect channels separated into a bit line side and a source line side to an unselected word line to which the isolation voltage VISO is applied, is applied). "removing the intermediate voltages VPA and VPB" includes, for example, a case of intentionally reducing voltage of an unselected word line from the intermediate voltages VPA and VPB by any arbitrary method.

Moreover, the isolation control unit 13A can make to apply the electric field relaxing voltage VGP to a word line adjacent to a word line to which the isolation voltage VISO is applied at the time of applying the program voltage VPGM and control the electric field relaxing voltage VGP so that channels between the bit line BL and a memory cell belonging to a selected row are connected to channels of memory cells belonging to unselected rows before the intermediate voltages VPA and VPB are removed.

At this time, the isolation control unit 13A can select a gate electrode of a memory cell to which the isolation voltage VISO is applied so that channels are separated between memory cells belonging to a written region and memory cells belonging to an unwritten region.

Figure 2:
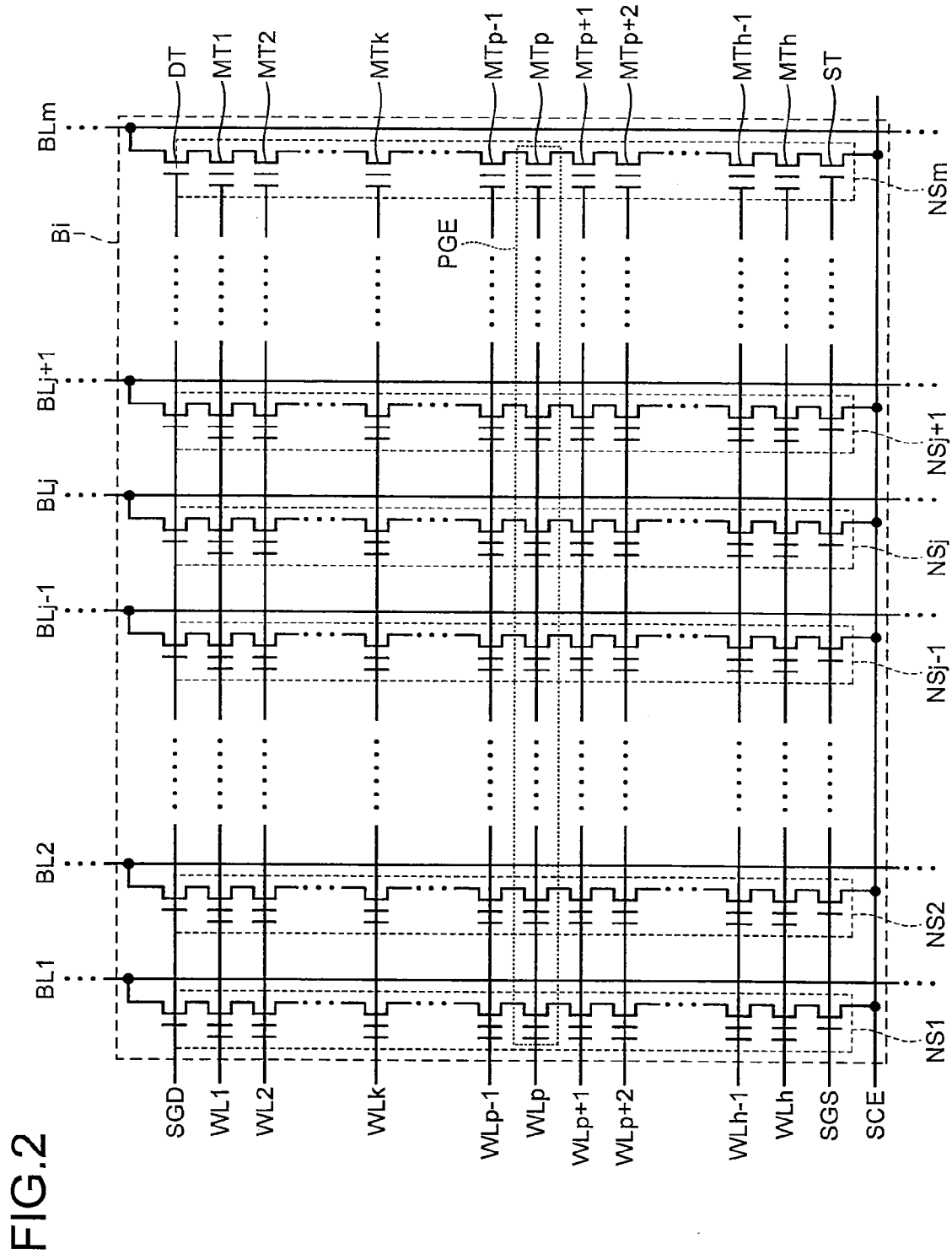
FIG. 2 is a circuit diagram illustrating a schematic configuration of a block of the nonvolatile semiconductor memory device in FIG. 1.

FIG. 2 is a circuit diagram illustrating a schematic configuration of a block of the nonvolatile semiconductor memory device in FIG. 1.

In FIG. 2, in the block Bi (i is an integer satisfying 1≤i≤n), h (h is a positive integer) number of word lines WL1 to WLh, select gate lines SGD and SGS, and a source line SCE are provided. Moreover, in the blocks B1 to Bn, m (m is a positive integer) number of bit lines BL1 to BLm are provided in common.

Then, in the block Bi, m number of NAND strings NS1 to NSm are provided in a row direction and the NAND strings NS1 to NSm are connected to the bit lines BL1 to BLm, respectively.

In each of the NAND strings NS1 to NSm, cell transistors MT1 to MTh and select transistors DT and ST are provided. One memory cell of the memory cell array 1 can be composed of one cell transistor MTk (k is an integer satisfying 1≤k≤h). Moreover, in each of the cell transistors MT1 to MTh, a charge storage region storing charges and a control gate electrode controlling storing of charges can be provided. The cell transistors MT1 to MTh are connected in series. The select transistor DT is connected in series with the cell transistor MT1 of the first stage and the select transistor ST is connected in series with the cell transistor MTh of the last stage to form the NAND string NSj (j is an integer satisfying 1≤j≤m).

In the NAND strings NS1 to NSm, the word lines WL1 to WLh are connected to the control gate electrodes of the cell transistors MT1 to MTh, respectively. Moreover, one end of the NAND string NSj is connected to the bit line BLj via the select transistor DT and the other end of the NAND string NSj is connected to the source line SCE via the select transistor ST.

Moreover, in the NAND strings NS1 to NSm, when storing 1 bit in one cell transistor, one page PGE can be composed of m number of memory cells formed of the cell transistors MTk connected to the word line WLk. Moreover, when storing p bits (p is an integer or two or more) in one cell transistor, p number of pages PGE can be composed of m number of memory cells formed of the cell transistors MTk connected to the word line WLk.

Writing in the nonvolatile semiconductor memory device in the present embodiment is performed for each page. In one block, a page to which data is to be written is called a selected row and a page to which data is not written is called an unselected row in some cases.

Figure 3A:
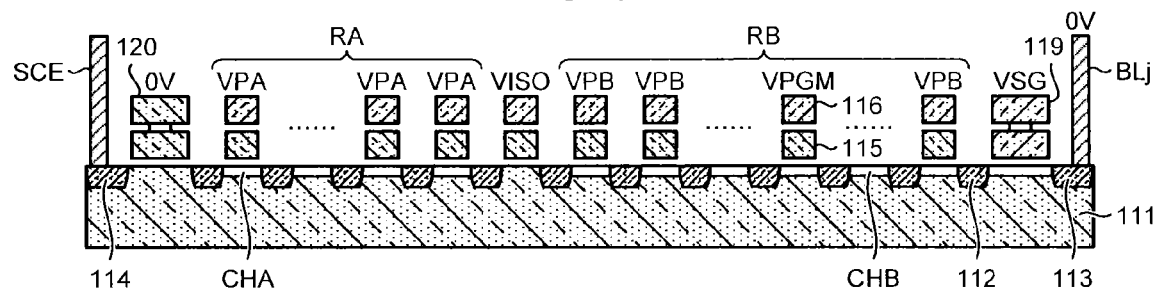
FIG. 3A to FIG. 3D are cross-sectional views illustrating a setting method of word line voltages at the time of writing for one NAND string of the nonvolatile semiconductor memory device in FIG. 1.
Figure 3B:
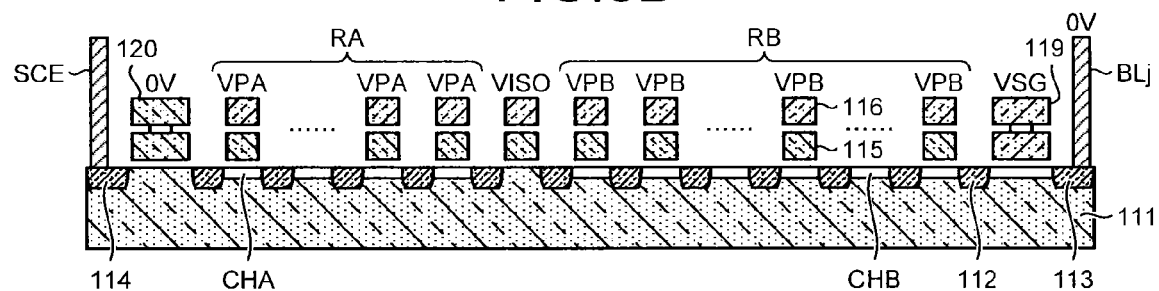
Figure 3C:
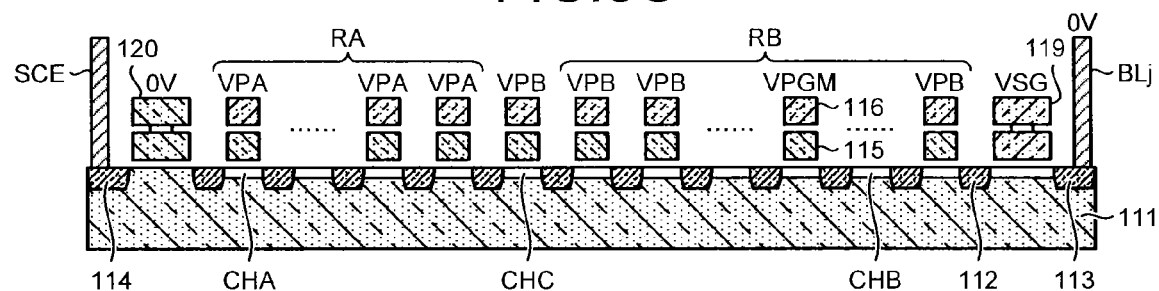
Figure 3D:
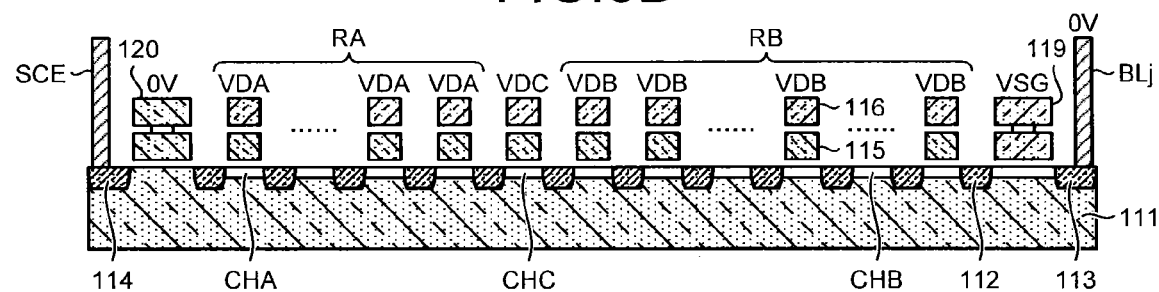
Figure 4:
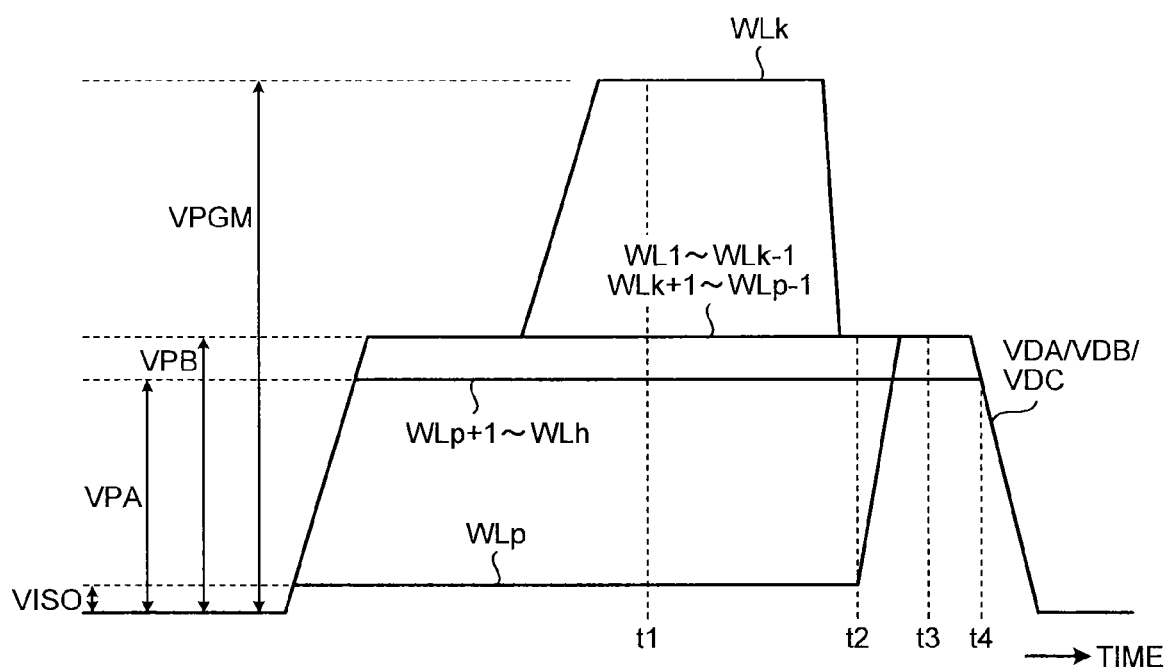
FIG. 4 is a diagram illustrating waveforms of word line voltages at the time of writing in the nonvolatile semiconductor memory device in FIG. 1.

FIG. 3A to FIG. 3D are cross-sectional views illustrating a setting method of word line voltages for one NAND string of the nonvolatile semiconductor memory device in FIG. 1 and FIG. 4 is a diagram illustrating waveforms of word line voltages at the time of writing in the nonvolatile semiconductor memory device in FIG. 1.

In FIG. 3A, charge storage layers 115 and select gate electrodes 119 and 120 are arranged on a well 111 and control gate electrodes 116 are arranged on the charge storage layers 115. The well 111 and the charge storage layer 115 can be insulated from each other via a not-shown tunnel dielectric film. The charge storage layer 115 and the control gate electrode 116 can be insulated from each other via a not-shown interelectrode dielectric film. One charge storage layer 115 and the control gate electrode 116 thereon can form one memory cell. A word line can be formed by sharing the control gate electrodes 116 between memory cells adjacent in the row direction.

In the well 111, an impurity diffusion layer 112, which is arranged between the charge storage layers 115 or between the charge storage layer 115 and the select gate electrode 119 connected to the select gate line SGD and the select gate electrode 120 connected to the select gate line SGS, are formed. Moreover, an impurity diffusion layer 113, which is adjacent to the select gate electrode 119 and is connected to a bit line, and an impurity diffusion layer 114, which is adjacent to the select gate electrode 120 and is connected to the source line SCE, are formed. For example, the well 111 can be formed into a P type and the impurity diffusion layers 112, 113, and 114 can be formed into an N type.

The impurity diffusion layer 113 is connected to the bit line BLj and the impurity diffusion layer 114 is connected to the source line SCE. The control gate electrodes 116 of memory cells are connected to the word lines WL1 to WLh, respectively, and the select gate electrodes 119 and 120 are connected to the select gate lines SGD and SGS, respectively.

In FIG. 2, FIG. 3, and FIG. 4A, in a write operation, the program voltage VPGM (for example, 20 V) is applied to the selected word line WLk of the block Bi (time t1 in FIG. 4). Moreover, in memory cells of the NAND string NSj, when there are a region RA and a region RB, the isolation voltage VISO (for example, 0 V or more and 1 V or less), which separates channels CHA formed in the region RA and channels CHB formed in the region RB, is applied to the unselected word line WLp (p is an integer satisfying k<p<h) between the region RA and the region RB. The region RA is a memory cell group present on the impurity diffusion layer 114 side of a word line to which the isolation voltage VISO is applied and the region RB is a memory cell group present on the impurity diffusion layer 113 side of a word line to which the isolation voltage VISO is applied. Because writing is performed from the impurity diffusion layer 114 side, writing has been performed on memory cells in the region RA. On the other hand, an unwritten memory cell is present among memory cells in the region RB (writing has not been performed on a memory cell on the impurity diffusion layer 114 side of a selected word line in some cases). For convenience sake, the region RA is referred to as a written region RA and the region RB is referred to as an unwritten region RB in some cases. Moreover, the intermediate voltage VPB sufficient to form the channels CHB in the cell transistors MT1 to MTk−1 and MTk+1 to MTp−1 is applied to the unselected word lines WL1 to WLk−1 and WLk+1 to WLp−1. Moreover, the intermediate voltage VPA sufficient to form the channels CHA in the cell transistors MTp+1 to MTh is applied to the unselected word lines WLp+1 to WLh.

Moreover, a write voltage (for example, 0 V) or a write inhibit voltage (for example, 2.5 V) is applied to the selected bit line BLj of the block Bi according to data to be written. For example, when data "0" is written to memory cell, the selected bit line BLj is set to 0 V, and when data "1" is written to memory cell, the selected bit line BLj is set to 2.5 V. The write inhibit voltage (for example, 2.5 V) is applied to the unselected bit lines BL1 to BLj−1 and BLj+1 to BLm.

Moreover, in relation to a bit line voltage, a voltage VSG, for example, 2.5 V is applied to the select gate line SGD, with which the select transistor DT is turned on when the threshold of the cell transistor MTk needs to be increased and the select transistor DT is turned off when the threshold of the cell transistor MTk is not increased. Moreover, low voltage (for example, 0 V) sufficient to turn off the select transistor ST is applied to the select gate line SGS.

When charges is injected into the charge storage layer 115 of the cell transistor MTk, voltage of 0 V applied to the bit line BLj is transferred to the NAND cell unit NSj because the select transistor DT is on. The voltage of 0 V applied to the bit line BLj is transferred to the drain of the cell transistor MTk via the cell transistors MT1 to MTk−1 of the NAND cell unit NSj and high voltage is applied to the control gate electrode 116 of a selected cell, so that the potential of the charge storage layer 115 of the selected cell increases. Therefore, charges are injected into the charge storage layer 115 from the drain of the selected cell by tunneling and thus the threshold of the cell transistor MTk increases, thereby performing a write operation of the data "0" to the selected cell.

On the other hand, when charges is not injected into the charge storage layer 115 of the cell transistor MTk, the select transistor DT is turned off by voltage of 2.5 V applied to the bit line BLj. Consequently, the potential of a channel of a selected cell connected to the selected word line WLk increases by so-called self boosting. Therefore, charges are not injected into the charge storage layer 115 from the drain of the selected cell. Thus, the threshold voltage of the cell transistor MTk does not increase, thereby performing a write operation of the data "1" to the selected cell.

The boost level of the channel CHA in the written region RA becomes lower than the boost level of the channel CHB in the unwritten region RB. Therefore, the effect of the boost level of the channel CHA with respect to the boost level of the channel CHB can be reduced by separating the channels CHA and CHB at the time of a write operation to a selected cell, so that the boost level of the channel CHB can be stabilized, enabling to reduce erroneous writing to the selected cell.

Next, in FIG. 2, FIG. 3B, and FIG. 4, application of the program voltage VPGM to the selected word line WLk is canceled and the intermediate voltage VPB is applied to the selected word line WLk (time t2 in FIG. 4).

Next, in FIG. 2, FIG. 3C, and FIG. 4, the intermediate voltage VPB is applied to the unselected word line WLp by increasing the isolation voltage VISO (time t3 in FIG. 4). At this time, a channel CHC connecting between the channels CHA and CHB is formed in the cell transistor MTp connected to the unselected word line WLp. The isolation voltage VISO can be increased up to the intermediate voltage VPB. Moreover, the isolation voltage VISO can be increased also up to the intermediate voltage VPA. Consequently, the number of voltages to be generated can be reduced, enabling to easily perform a write operation.

Next, in FIG. 2, FIG. 3D, and FIG. 4, the intermediate voltage VPB applied to the selected word line WLk and the unselected word lines WL1 to WLk−1 and WLk+1 to WLp is canceled and at substantially the same time, the intermediate voltage VPA applied to the unselected word lines WLp+1 to WLh is removed (time t4 in FIG. 4).

It is possible to make a transient voltage VDA of the unselected word lines WLp+1 to WLh, a transient voltage VDB of the selected word line WLk and the unselected word lines WL1 to WLk−1 and WLk+1 to WLp31 1, and a transient voltage VDC of the unselected word line WLp approximately equal after removing the intermediate voltages VPB and VPA by connecting between the channels CHA and CHB via the channel CHC before removing the intermediate voltages VPB and VPA.

Therefore, after the intermediate voltages VPB and VPA are canceled, a large potential difference can be suppressed from occurring between the unselected word lines WLp−1, WLp, and WLp+1. Thus, it is possible to prevent that hot electrons are generated near a channel portion of the unselected word line WLp to make erroneous writing to a memory cell connected to the unselected word line WLp. Consequently, erroneous writing to an unselected cell by channel isolation can be reduced.

As a method of applying the intermediate voltage VPB to the unselected word line WLp, the unselected word lines WL1 to WLk−1 and WLk+1 to WLp−1, and the unselected word line WLp may be driven separately or the unselected word lines WL1 to WLk−1 and WLk+1 to WLp−1 and the unselected word line WLp may be short-circuited. As a method of applying the intermediate voltage VPA to the unselected word line WLp, in the similar manner, the unselected word lines WLp+1 to WLh and the unselected word line WLp may be driven separately or the unselected word lines WLp+1 to WLh and the unselected word line WLp may be short-circuited.

Second Embodiment

FIG. 5A to FIG. 5D are cross-sectional views illustrating a setting method of word line voltages at the time of writing for one NAND string of a nonvolatile semiconductor memory device according to the second embodiment and FIG. 6A to FIG. 6E are diagrams illustrating waveforms of word line voltages at the time of writing in the nonvolatile semiconductor memory device according to the second embodiment.

Figure 5A:
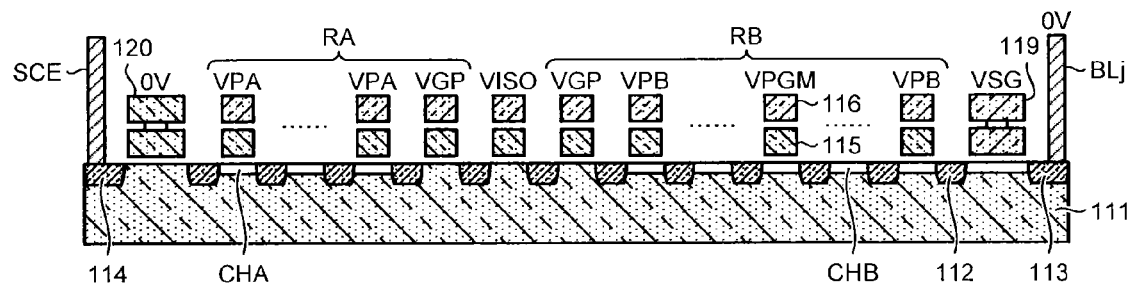
FIG. 5A to FIG. 5D are cross-sectional views illustrating a setting method of word line voltages at the time of writing for one NAND string of a nonvolatile semiconductor memory device according to a second embodiment.
Figure 5B:
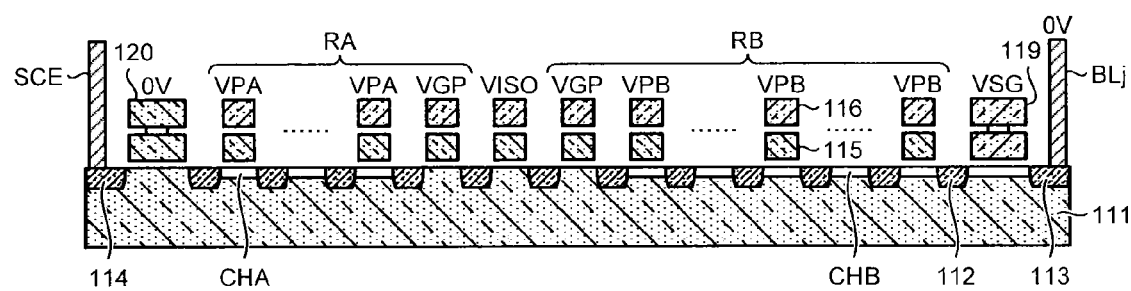
Figure 5C:
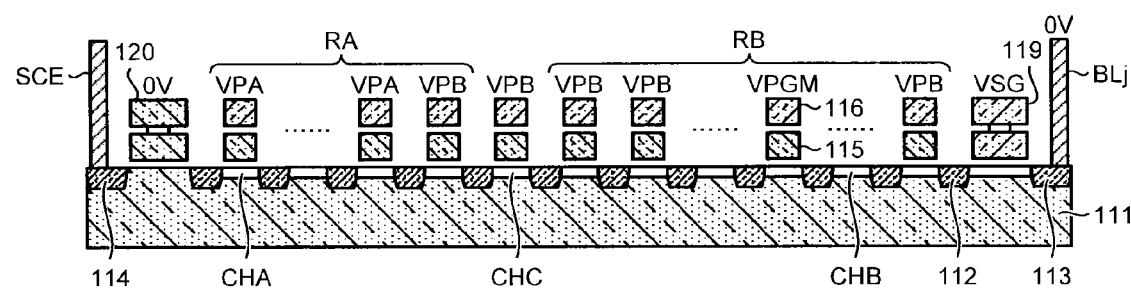
Figure 5D:
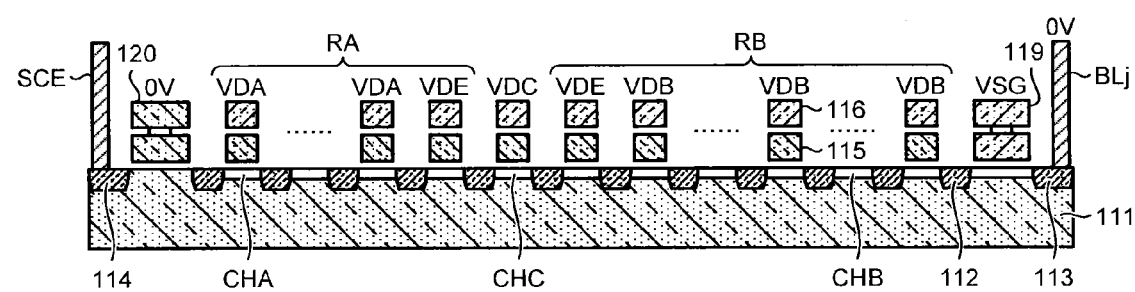
Figure 6A:
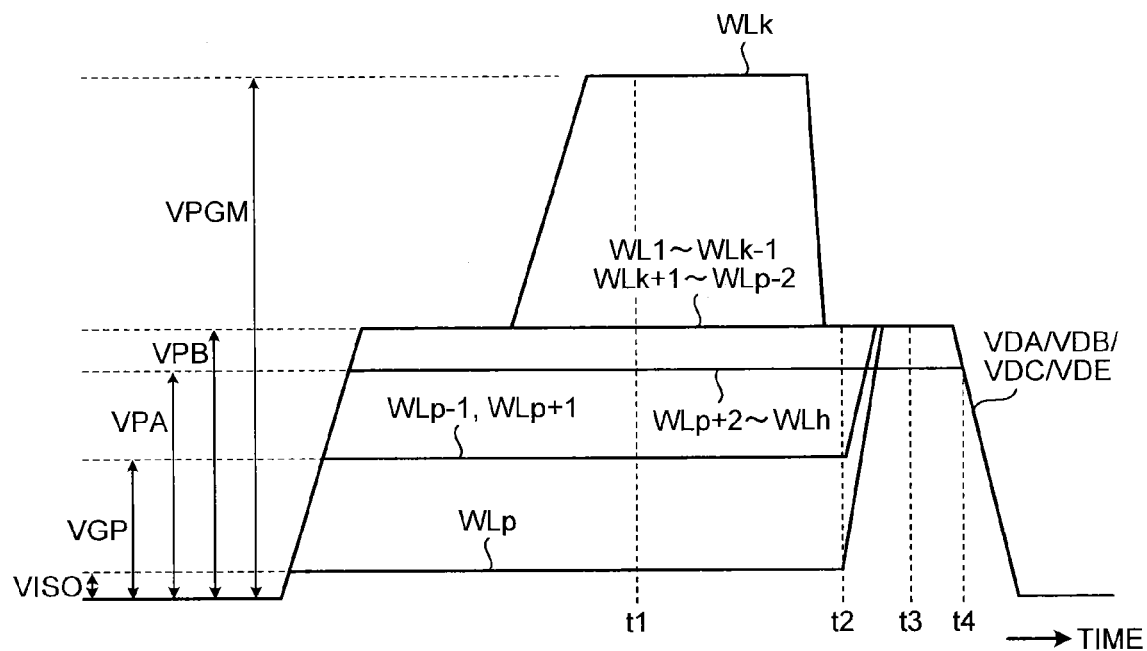
FIG. 6A to FIG. 6E are diagrams illustrating waveforms of word line voltages at the time of writing in the nonvolatile semiconductor memory device according to the second embodiment.

In FIG. 2, FIG. 5A to FIG. 5D, and FIG. 6A, in a write operation, the program voltage VPGM (for example, 20 V) is applied to the selected word line WLk of the block Bi (time t1 in FIG. 6A). Moreover, the isolation voltage VISO, which separates the channels CHA and CHB, is applied to the unselected word line WLp. Moreover, the intermediate voltage VPB sufficient to form the channels CHB in the cell transistors MT1 to MTk−1 and MTk+1 to MTp−2 is applied to the unselected word lines WL1 to WLk−1 and WLk+1 to WLp−2. Moreover, the intermediate voltage VPA sufficient to form the channels CHA in the cell transistors MTp+2 to MTh is applied to the unselected word lines WLp+2 to WLh. Furthermore, the electric field relaxing voltage VGP, which relaxes the electric field of the channels CHA and CHB near the unselected word line WLp, is applied to the unselected word lines WLp−1 and WLp+1 adjacent to both sides of the unselected word line WLp (VISO<VGP<VPA≤VPB<VPGM).

Moreover, the write voltage (for example, 0 V) or the write inhibit voltage (for example, 2.5 V) is applied to the selected bit line BLj of the block Bi according to data to be written. The write inhibit voltage (for example, 2.5 V) is applied to the unselected bit lines BL1 to BLj−1 and BLj+1 to BLm.

Moreover, in relation to the bit line voltage, voltage is applied to the select gate line SGD, with which the select transistor DT is turned on when the threshold of the cell transistor MTk is increased and the select transistor DT is turned off when the threshold of the cell transistor MTk is not increased. Moreover, low voltage sufficient to turn off the select transistor ST is applied to the select gate line SGS.

Next, in FIG. 2, FIG. 5B, and FIG. 6A, application of the program voltage VPGM to the selected word line WLk is canceled and the intermediate voltage VPB is applied to the selected word line WLk (time t2 in FIG. 6).

Next, in FIG. 2, FIG. 5C, and FIG. 6A, the intermediate voltage VPB is applied to the unselected word lines WLp−1, WLp, and WLp+1 by increasing the isolation voltage VISO and the electric field relaxing voltage VGP (time t3 in FIG. 6A). At this time, the channels CHC connecting between the channels CHA and CHB are formed in the cell transistors MTp−1, MTp, and MTp+1 connected to the unselected word lines WLp−1, WLp, and WLp+1, respectively. The isolation voltage VISO and the electric field relaxing voltage VGP can be increased up to the intermediate voltage VPB. Moreover, the isolation voltage VISO and the electric field relaxing voltage VGP can be increased also up to the intermediate voltage VPA. Consequently, the number of voltages to be generated can be reduced, enabling to easily perform a write operation.

Next, in FIG. 2, FIG. 5D, and FIG. 6A, the intermediate voltage VPB applied to the selected word line WLk and the unselected word lines WL1 to WLk−1 and WLk+1 to WLp+1 is canceled and at the same time, the intermediate voltage VPA applied to the unselected word lines WLp+2 to WLh is canceled (time t4 in FIG. 6A).

Therefore, after the intermediate voltages VPB and VPA are canceled, a potential difference can be suppressed from occurring between the unselected word lines WLp−2, WLp−1, WLp, WLp+1, and WLp+2 and therefore it becomes possible to prevent that hot electrons are generated near the channel CHC, so that erroneous writing to an unselected cell due to channel isolation can be reduced.

Figure 6B:
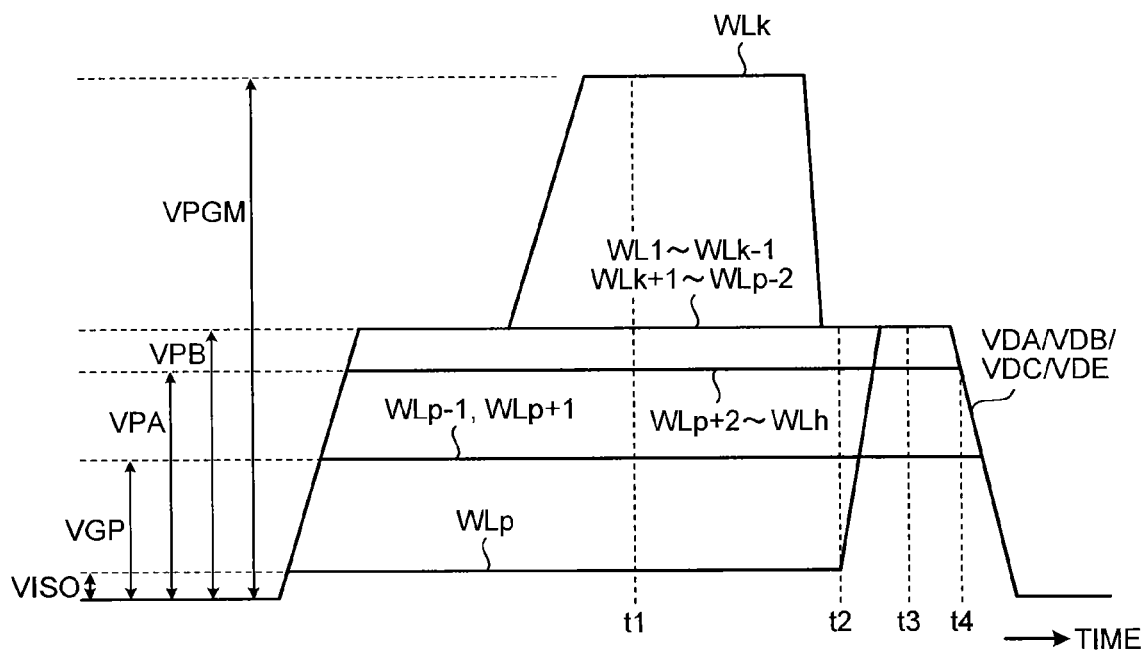
Figure 6C:
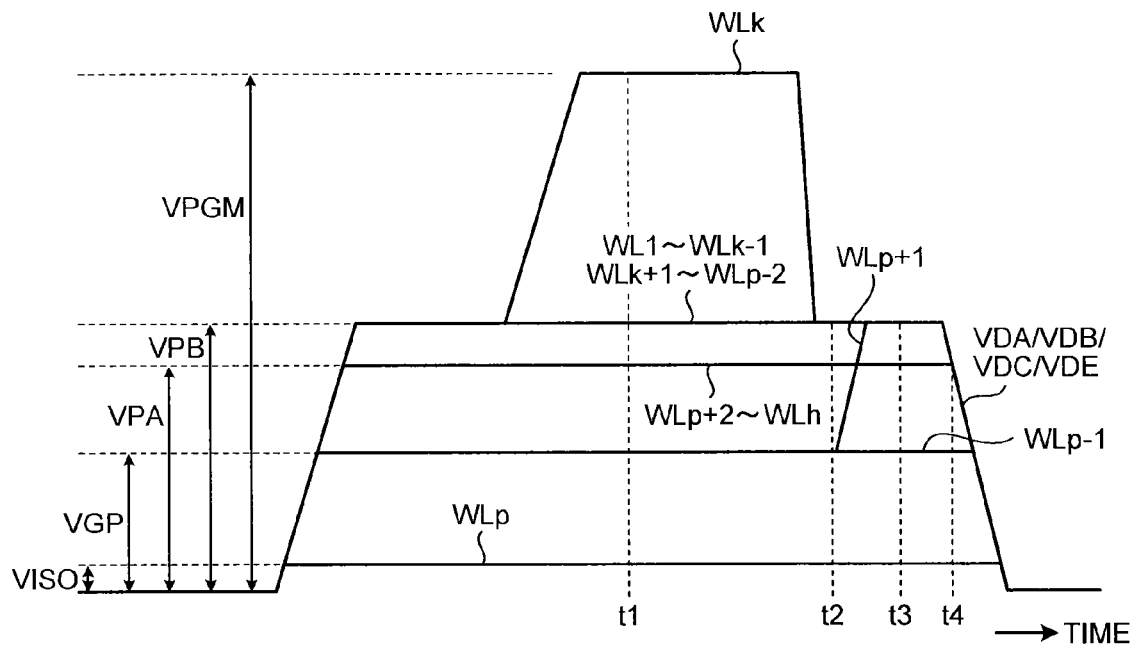
Figure 6D:
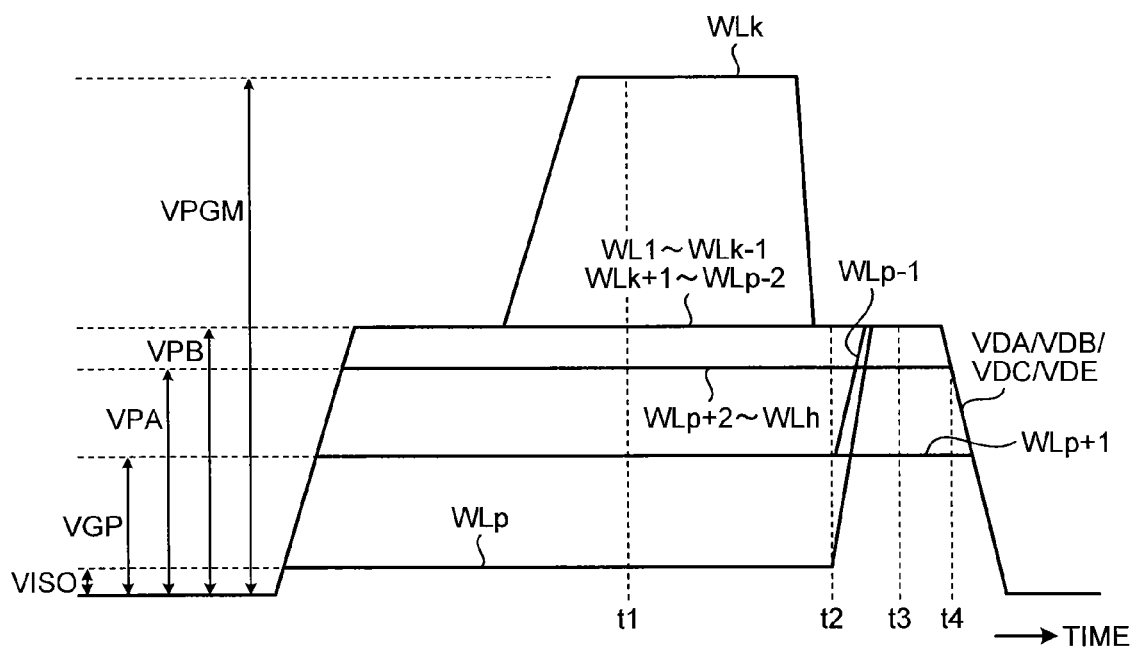
Figure 6E:
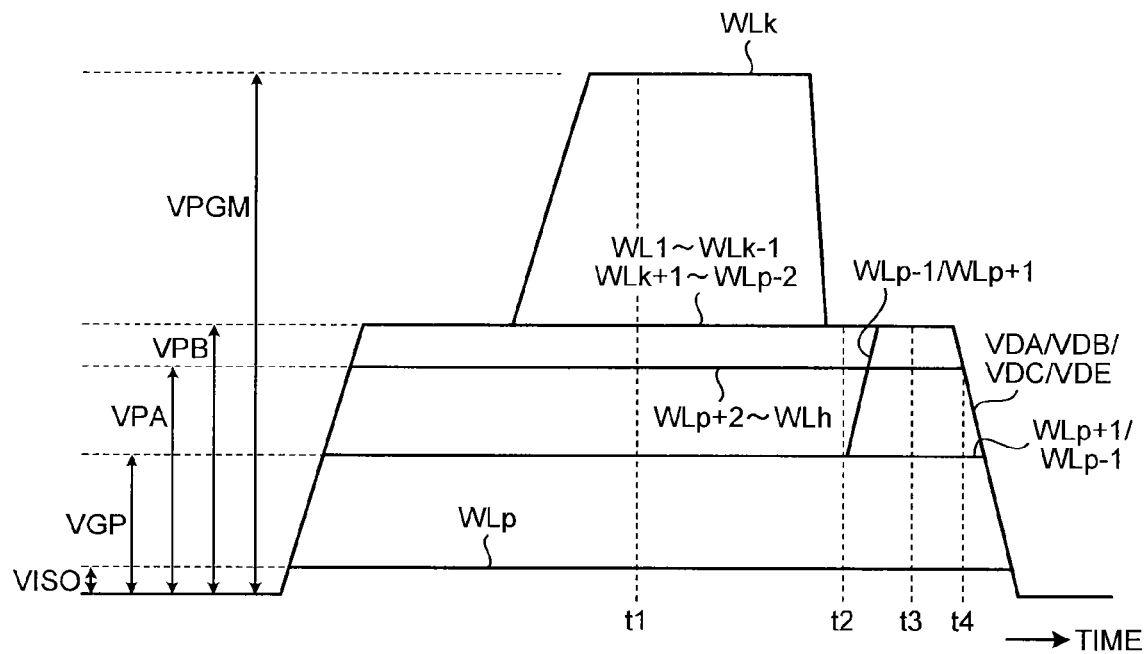

Only the isolation voltage VISO may be increased (FIG. 6B). Moreover, the isolation voltage VISO and the electric field relaxing voltage VGP applied to the unselected word line WLp+1 may be increased (FIG. 6C). Moreover, the isolation voltage VISO and the electric field relaxing voltage VGP applied to the unselected word line WLp−1 may be increased (FIG. 6D). Moreover, any one of the electric field relaxing voltages VGP may be increased (FIG. 6E).

Third Embodiment

Figure 7:
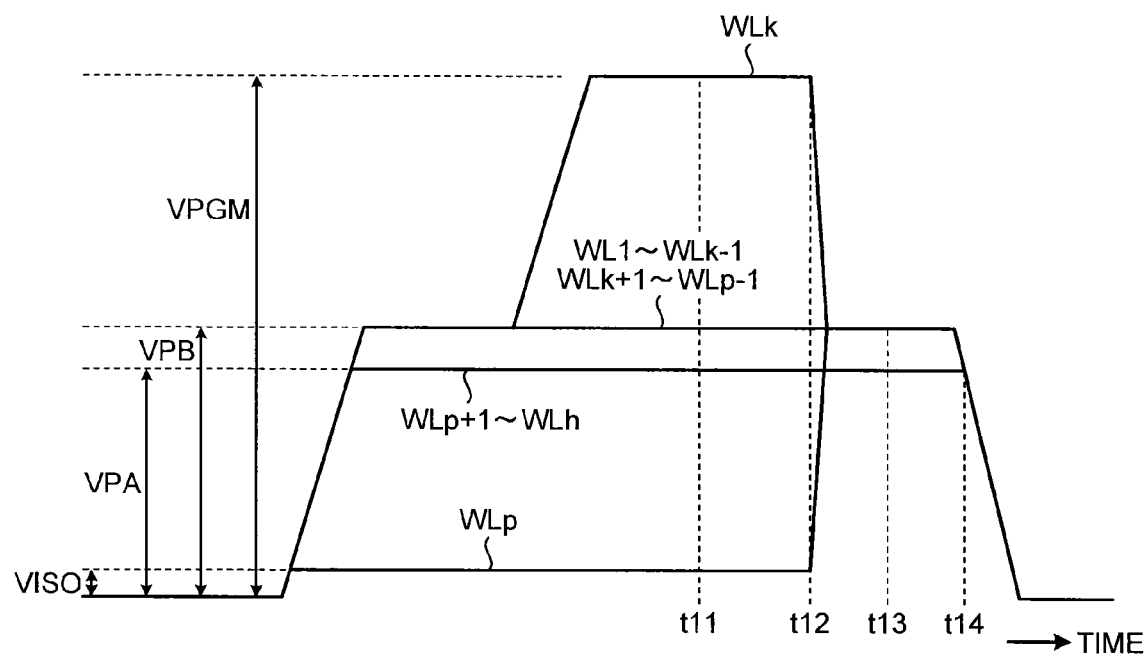
FIG. 7 is a diagram illustrating waveforms of word line voltages at the time of writing in a nonvolatile semiconductor memory device according to a third embodiment.

FIG. 7 is a diagram illustrating waveforms of word line voltages at the time of writing in a nonvolatile semiconductor memory device according to the third embodiment.

In FIG. 2, FIG. 3A, and FIG. 7, in a write operation, the program voltage VPGM (for example, 20 V) is applied to the selected word line WLk of the block Bi (time t11 in FIG. 7). The isolation voltage VISO, which separates the channels CHA and CHB, is applied to the unselected word line WLp. Moreover, the intermediate voltage VPB sufficient to form the channels CHB in the cell transistors MT1 to MTk−1 and MTk+1 to MTp−1 is applied to the unselected word lines WL1 to WLk−1 and WLk+1 to WLp−1. Moreover, the intermediate voltage VPA sufficient to form the channels CHA in the cell transistors MTp+1 to MTh is applied to the unselected word lines WLp+1 to WLh.

Moreover, the write voltage (for example, 0 V) or the write inhibit voltage (for example, 2.5 V) is applied to the selected bit line BLj of the block Bi according to data to be written. The write inhibit voltage (for example, 2.5 V) is applied to the unselected bit lines BL1 to BLj−1 and BLj+1 to BLm.

Moreover, in relation to the bit line voltage, voltage is applied to the select gate line SGD, with which the select transistor DT is turned on when the threshold of the cell transistor MTk is increased and the select transistor DT is turned off when the threshold of the cell transistor MTk is not increased. Moreover, low voltage sufficient to turn off the select transistor ST is applied to the select gate line SGS.

Next, in FIG. 2 and FIG. 7, application of the program voltage VPGM to the selected word line WLk is canceled, and the intermediate voltage VPB is applied to the selected word line WLk and the selected word line WLk and the unselected word line WLp are short-circuited (time t12 in FIG. 7). Consequently, as shown in FIG. 3C and FIG. 7, the intermediate voltage VPB is applied to the unselected word line WLp (time t13 in FIG. 7). At this time, the channel CHC connecting between the channels CHA and CHB is formed in the cell transistor MTp connected to the unselected word line WLp.

Next, in FIG. 2, FIG. 3D, and FIG. 7, the intermediate voltage VPB applied to the selected word line WLk and the unselected word lines WL1 to WLk−1 and WLk+1 to WLp is canceled and at the same time, the intermediate voltage VPA applied to the unselected word lines WLp+1 to WLh is canceled (time t14 in FIG. 7).

Therefore, after the intermediate voltages VPB and VPA are canceled, it becomes possible to prevent that hot electrons are generated near the channel CHC, so that erroneous writing to an unselected cell due to channel isolation can be reduced and the intermediate voltage VPB can be applied to the unselected word line WLp immediately after removing application of the program voltage VPGM, enabling to suppress increase in a write cycle.

Figure 8A:
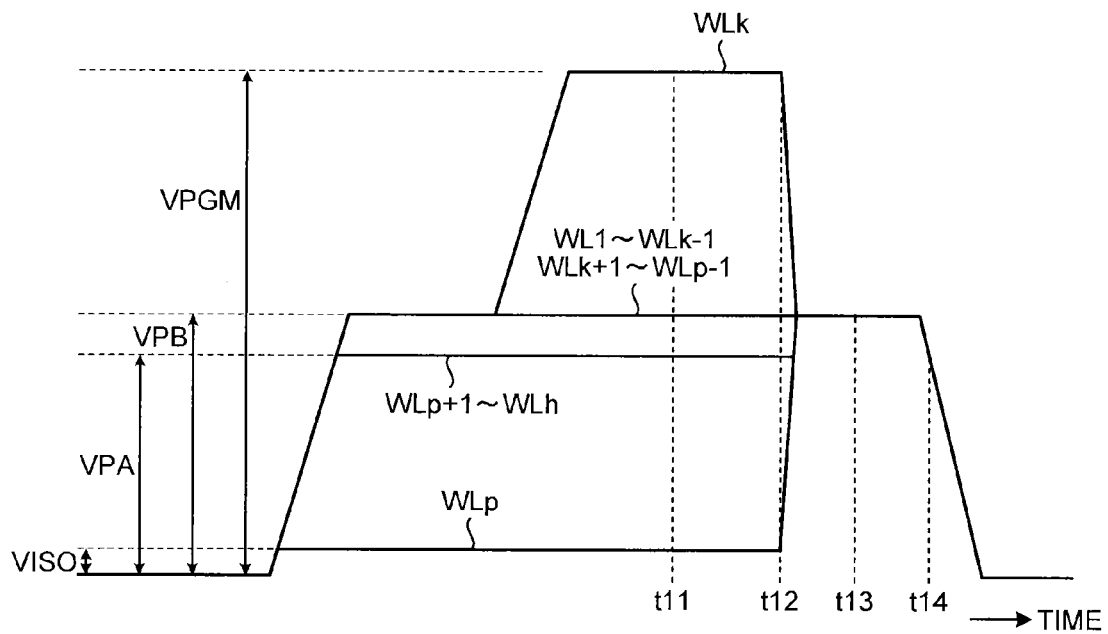
FIG. 8A to FIG. 8F are diagrams illustrating waveforms of word line voltages at the time of writing in a nonvolatile semiconductor memory device according to a fourth embodiment.

Moreover, as shown in FIG. 8A, the intermediate voltage VPB may be applied to the selected word line WLk and the selected word line WLk and the unselected word lines WLp and WLp+1 to h can be short-circuited.

Figure 8B:
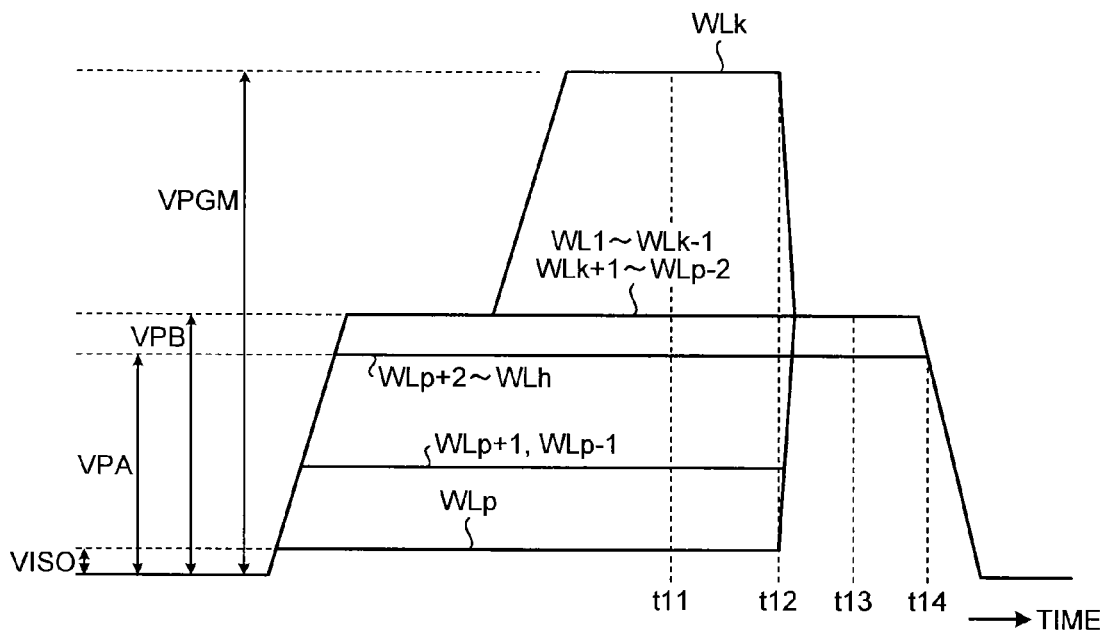
Figure 8C:
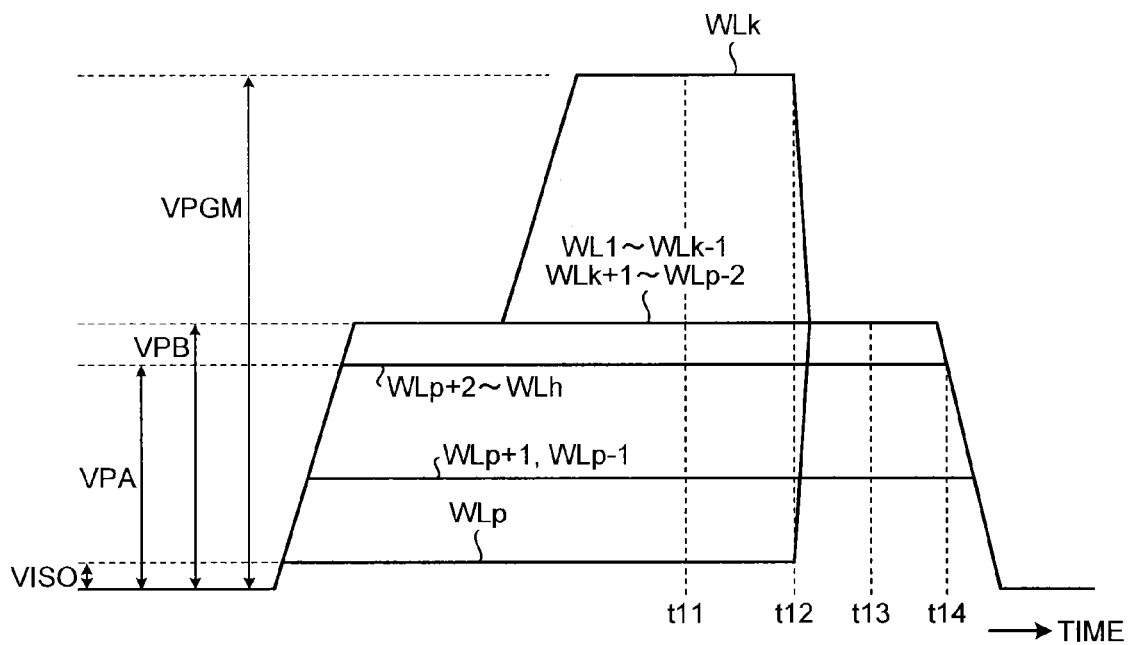
Figure 8D:
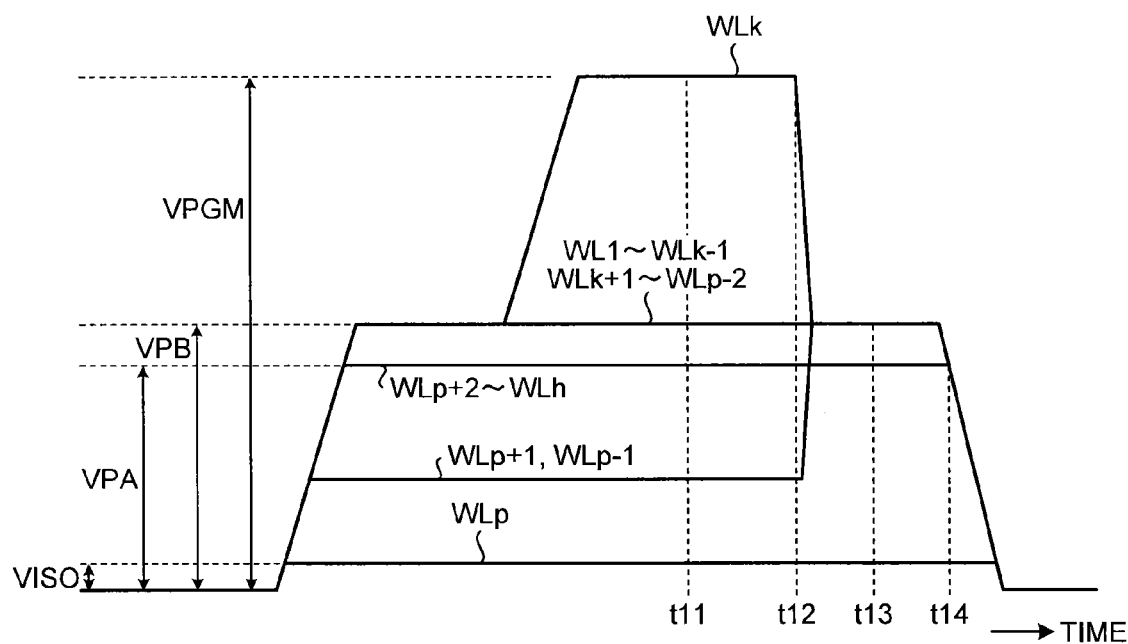
Figure 8E:
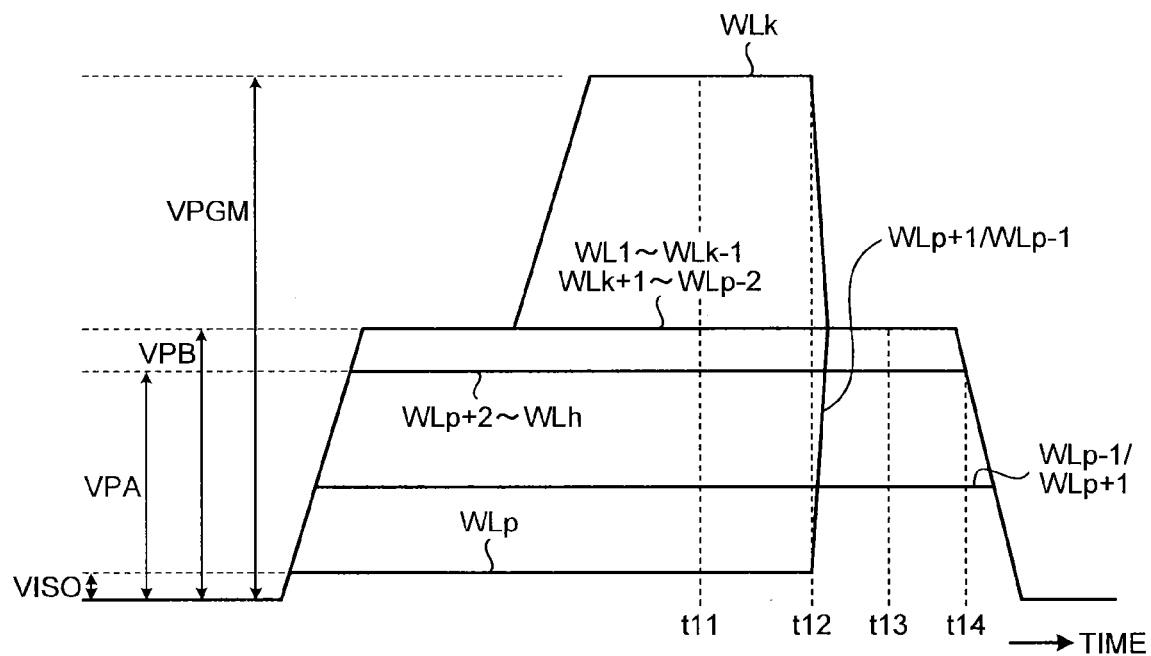
Figure 8F:
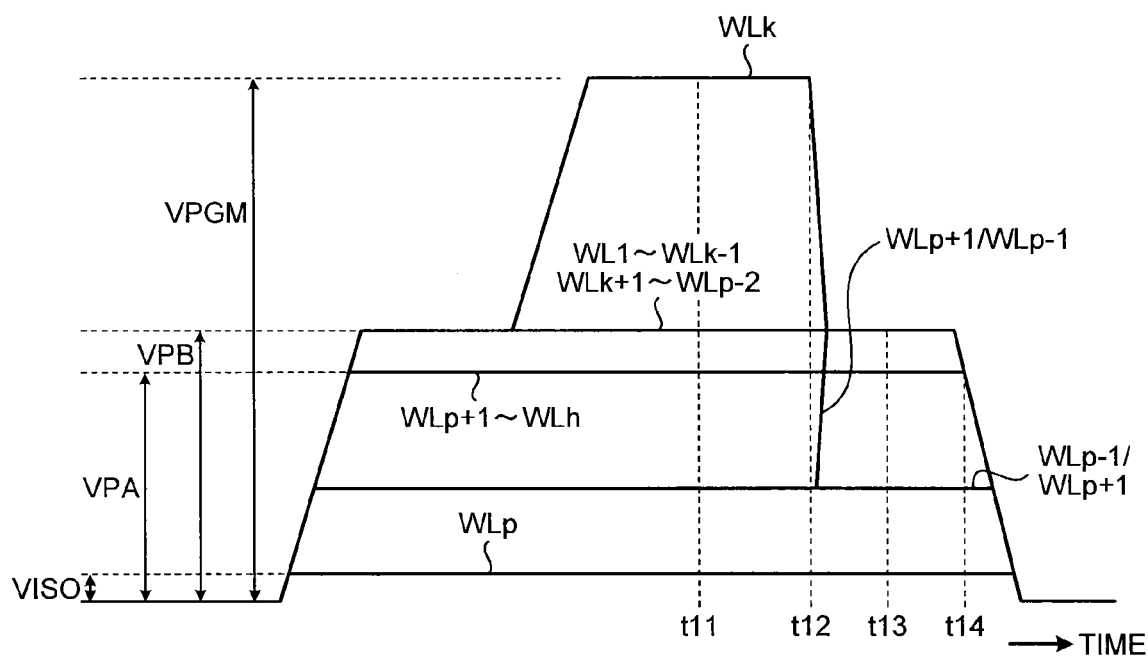
Figure 9A:
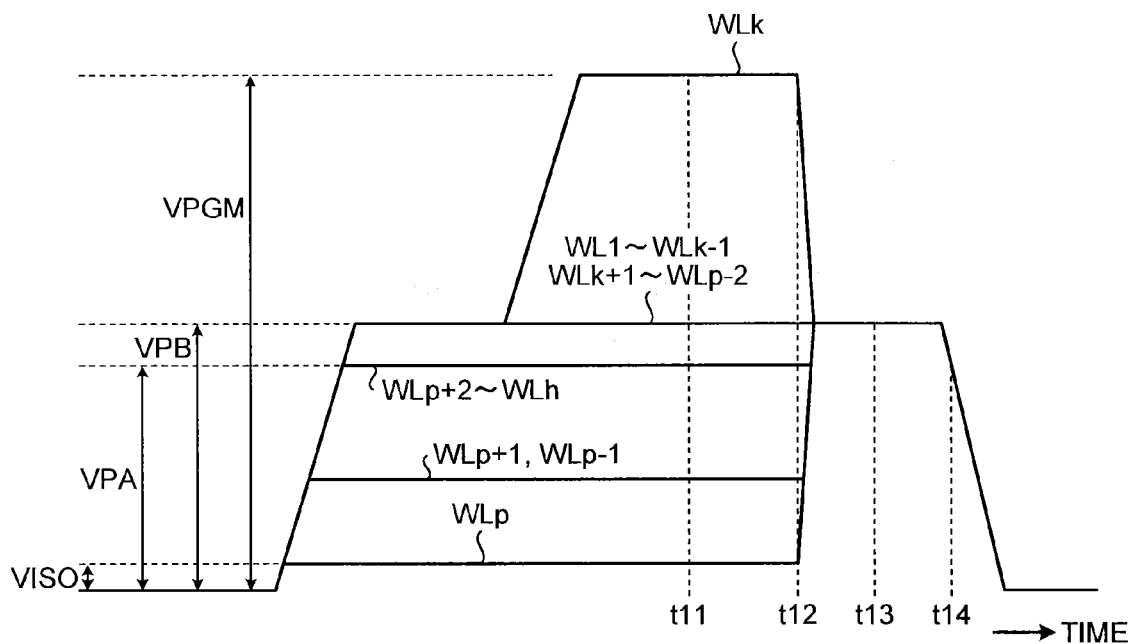
FIG. 9A to FIG. 9E are diagrams illustrating waveforms of word line voltages at the time of writing in a nonvolatile semiconductor memory device according to a fifth embodiment.
Figure 9B:
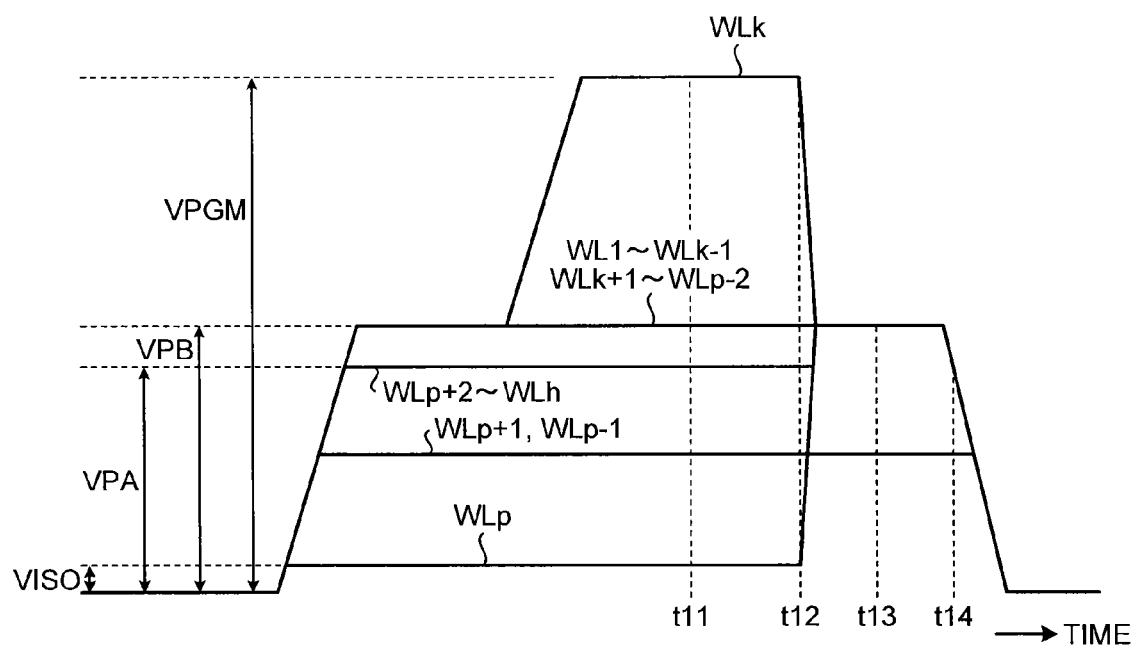
Figure 9C:
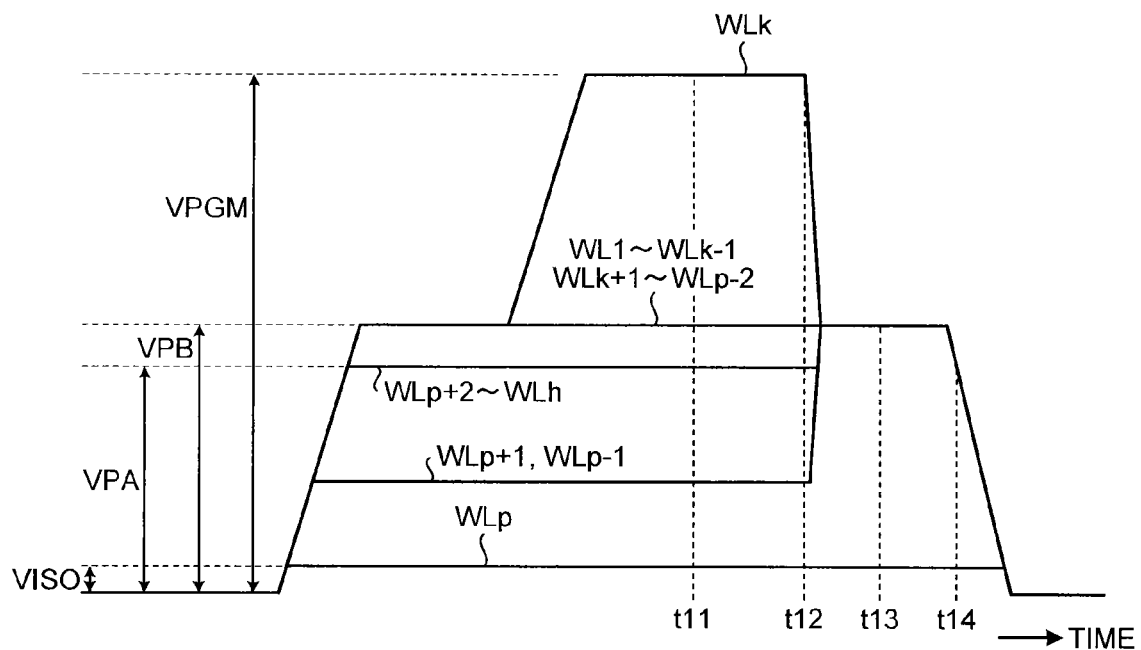
Figure 9D:
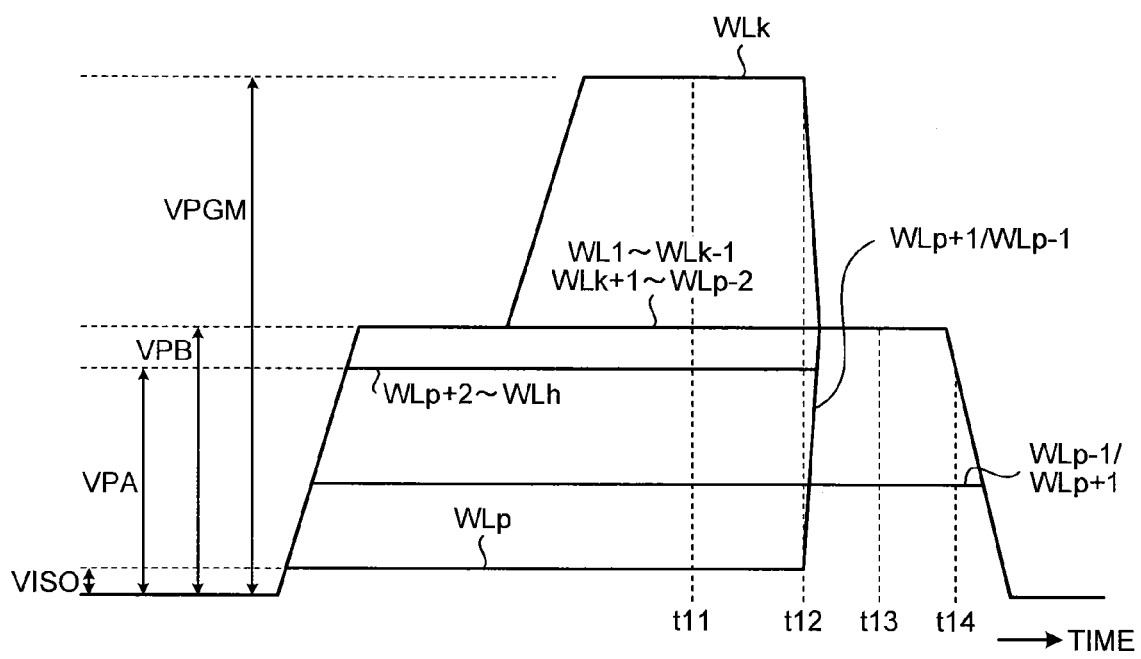
Figure 9E:
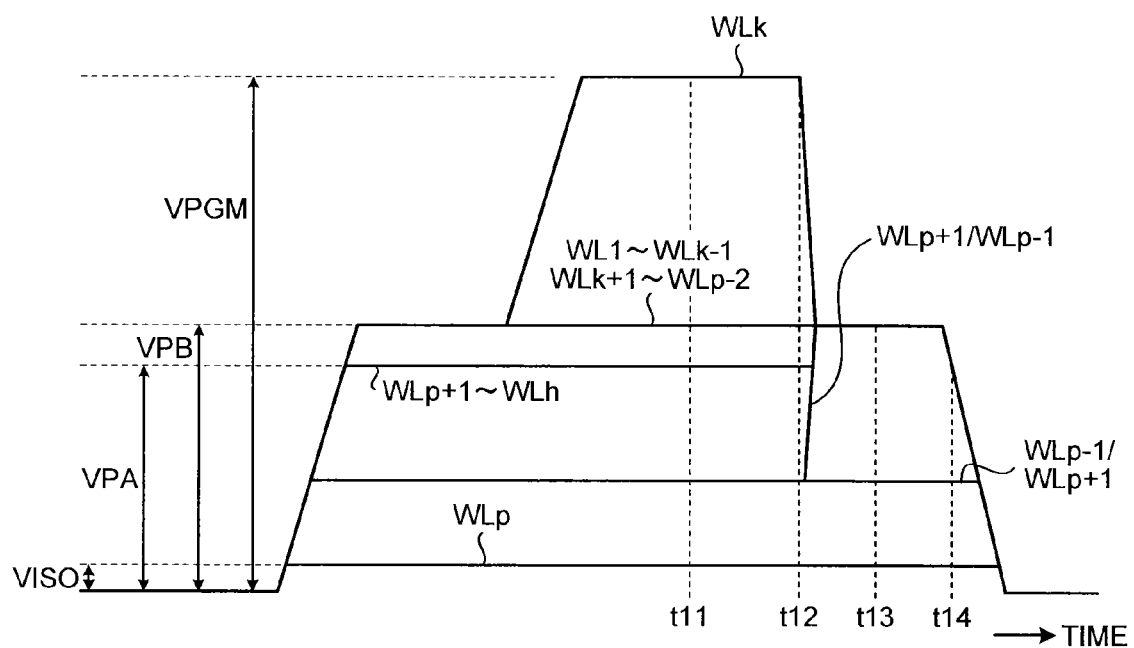

Moreover, the isolation control unit 13A may make to apply the electric field relaxing voltage VGP to a word line adjacent to a word line to which the isolation voltage VISO is applied. Moreover, as shown in FIG. 8B, the intermediate voltage VPB may be applied to the selected word line WLk and the selected word line WLk and the unselected word lines WLp, WLp−1, and WLp+1 can be short-circuited. Moreover, as shown in FIG. 8C, the intermediate voltage VPB may be applied to the selected word line WLk and the selected word line WLk and the unselected word lines WLp can be short-circuited. Moreover, as shown in FIG. 8D, the intermediate voltage VPB may be applied to the selected word line WLk and the selected word line WLk and only the unselected word lines WLp−1 and WLp+1 can be short-circuited. Moreover, as shown in FIG. 8E, the intermediate voltage VPB may be applied to the selected word line WLk and the selected word line WLk and the unselected word line WLp and only any one of the unselected word line WLp−1 and the unselected word line WLp+1 may be short-circuited. Moreover, as shown in FIG. 8F, the intermediate voltage VPB can be applied to the selected word line WLk and the selected word line WLk and only any one of the unselected word line WLp−1 and the unselected word line WLp+1 can be short-circuited.

Moreover, as shown in FIG. 9A to FIG. 9E, in addition to FIG. 8B to FIG. 8F, the unselected word lines WLp+2 to h may also be short-circuited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell array in which memory cells forming NAND strings are arranged in a matrix manner in a row direction and a column direction; and
   word lines that select a memory cell in the row direction;
   bit lines that select a memory cell in the column direction; and
   a write control unit that performs writing on a selected memory cell connected to a selected word line to apply an intermediate voltage to unselected word lines and apply a program voltage to the selected word line, wherein the write control unit controls to apply an isolation voltage to an one of the unselected word lines at a time of applying the program voltage and increase the isolation voltage before the intermediate voltage is canceled after applying the program voltage.

2. The nonvolatile semiconductor memory device according to claim 1, wherein the write control unit controls to apply an electric field relaxing voltage to an another of unselected word lines adjacent to the one of the unselected word lines at a time of applying the program voltage and increase the electric field relaxing voltage before the intermediate voltage is canceled after applying the program voltage.

3. The nonvolatile semiconductor memory device according to claim 1, wherein the write control unit selects the one of the unselected word lines to which the isolation voltage is applied so that a channel is separated between a first region and a second region.

4. The nonvolatile semiconductor memory device according to claim 1, wherein the write control unit makes the isolation voltage equal to the intermediate voltage before the intermediate voltage is canceled.

5. The nonvolatile semiconductor memory device according to claim 1, wherein the write control unit short-circuits the one of the unselected word lines and an another of unselected word lines adjacent to the one of the unselected word lines, before the intermediate voltage is canceled.

6. The nonvolatile semiconductor memory device according to claim 1, wherein the write control unit short-circuits the one of the unselected word lines and an another of unselected word lines adjacent to the one of the unselected word lines, at a same timing as a timing at which application of the program voltage is removed.

7. The nonvolatile semiconductor memory device according to claim 1, wherein the write control unit increases the isolation voltage until a channel of a memory cell connected to the one of the unselected word lines is applied is formed, before the intermediate voltage is canceled after applying the program voltage.

8. The nonvolatile semiconductor memory device according to claim 3, wherein the write control unit controls the isolation voltage to apply a positive voltage that connects the first region and the second region before the intermediate voltage is canceled after applying the program voltage.

9. The nonvolatile semiconductor memory device according to claim 1, further comprising a NAND cell unit that includes
a NAND string in which cell transistors are connected in series,
a first select transistor connected to one end of the NAND string, and
a second select transistor connected to another end of the NAND string.

10. The nonvolatile semiconductor memory device according to claim 3, wherein the first region is a written region and the second region is an unwritten region.

11. The nonvolatile semiconductor memory device according to claim 1, wherein the write control unit applies the isolation voltage to the one of the unselected word lines to separate a channel in the NAND string into a channel on a bit line side and a channel on a source line side, before applying the program voltage.

12. The nonvolatile semiconductor memory device according to claim 1, wherein the intermediate voltage is lower than the program voltage and is higher than the isolation voltage.

13. The nonvolatile semiconductor memory device according to claim 2, wherein the intermediate voltage is lower than the program voltage and is higher than the electric field relaxing voltage and the isolation voltage.

14. The nonvolatile semiconductor memory device according to claim 13, wherein the electric field relaxing voltage is higher than the isolation voltage.

15. The nonvolatile semiconductor memory device according to claim 1, wherein the write control unit applies the intermediate voltage and the isolation voltage before applying the program voltage.

16. The nonvolatile semiconductor memory device according to claim 2, wherein the control unit applies the intermediate voltage, the electric field relaxing voltage, and the isolation voltage before applying the program voltage.

* * * * *